(12) United States Patent
Ong et al.

(10) Patent No.: US 12,745,435 B2
(45) Date of Patent: Sep. 22, 2026

(54) SRAM WITH NANORIBBON WIDTH MODULATION FOR GREATER READ STABILITY

(71) Applicant: Intel Corporation, Santa Clara, CA (US)

(72) Inventors: Clifford Ong, Portland, OR (US); Leonard Guler, Hillsboro, OR (US); Smita Shridharan, Hillsboro, OR (US); Zheng Guo, Hillsboro, OR (US); Eric Karl, Portland, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 444 days.

(21) Appl. No.: 17/560,779

(22) Filed: Dec. 23, 2021

(65) Prior Publication Data

US 2023/0209797 A1 Jun. 29, 2023

(51) Int. Cl.
*H10D 62/10* (2025.01)

(52) U.S. Cl.
CPC .................................. *H10D 62/121* (2025.01)

(58) Field of Classification Search
CPC ............. H10D 30/014; H10D 30/6735; H10D 30/506; H10D 62/121
See application file for complete search history.

(56) References Cited

U.S. PATENT DOCUMENTS 10,741,564 B2 * 8/2020 Lee ...................... H10D 64/258
2013/0056795 A1 * 3/2013 Wu ...................... H10D 30/797 257/E29.255
2013/0244392 A1 * 9/2013 Oh ...................... H10D 62/235 438/299
2014/0131813 A1 * 5/2014 Liaw .................... H10D 84/853 438/689
2015/0137262 A1 * 5/2015 Baek .................... H10D 84/853 257/401

(Continued)

OTHER PUBLICATIONS

Song, Taejoong, et al., "A 3nm Gate-All-Around SRAM Featuring an Adaptive Dual-BL and an Adaptive Cell-Power Assist Circuit" , ISSCC 2021, Session 24, Advanced Embedded Memories, 24.3, 3 pgs.

(Continued)

*Primary Examiner* — Joseph C. Nicely
(74) *Attorney, Agent, or Firm* — Essential Patents Group, LLP

(57) ABSTRACT

Integrated circuit (IC) static random-access memory (SRAM) comprising colinear pass-gate transistors and pull-down transistors having different nanoribbon widths. A narrower ribbon width within the pass-gate transistor, relative to the pull-down transistor, may reduce read instability of a bit-cell, and/or reduce overhead associated with read assist circuitry coupled to the bit-cell. In some examples, a transition between narrower and width ribbon widths is symmetrical about a centerline shared by ribbons of both the access and pull-down transistors. In some examples, the ribbon width transition is positioned within an impurity-doped semiconductor region shared by the access and pull-down transistors and may be located under a terminal contact metallization. In some examples, the impurity-doped semiconductor regions surrounding the ribbons of differing width also have differing widths.

19 Claims, 9 Drawing Sheets

(56) References Cited

U.S. PATENT DOCUMENTS

| | | | | |
|---|---|---|---|---|
| 2016/0204263 | A1* | 7/2016 | Mukherjee | H10D 30/6212<br>257/190 |
| 2020/0135740 | A1 | 4/2020 | Liaw | |
| 2020/0295002 | A1* | 9/2020 | Snyder | H10D 30/62 |
| 2021/0020643 | A1* | 1/2021 | Yang | H10D 30/6211 |
| 2021/0066291 | A1* | 3/2021 | Lin | H10D 30/472 |
| 2021/0305084 | A1* | 9/2021 | Lin | H10W 10/021 |
| 2023/0032523 | A1* | 2/2023 | Liaw | H10D 30/43 |
| 2023/0046028 | A1* | 2/2023 | Pao | H10D 30/6735 |
| 2023/0180451 | A1* | 6/2023 | Lin | H10D 84/0186<br>257/288 |
| 2023/0200039 | A1* | 6/2023 | Choi | H10B 10/12<br>365/154 |
| 2025/0308581 | A1* | 10/2025 | Liaw | H10D 30/6735 |
| 2026/0096161 | A1* | 4/2026 | Raghavan | H10D 62/121 |

OTHER PUBLICATIONS

Extended European Search Report from European Patent Application No. 22214738.1 notified May 15, 2023, 8 pgs.

* cited by examiner

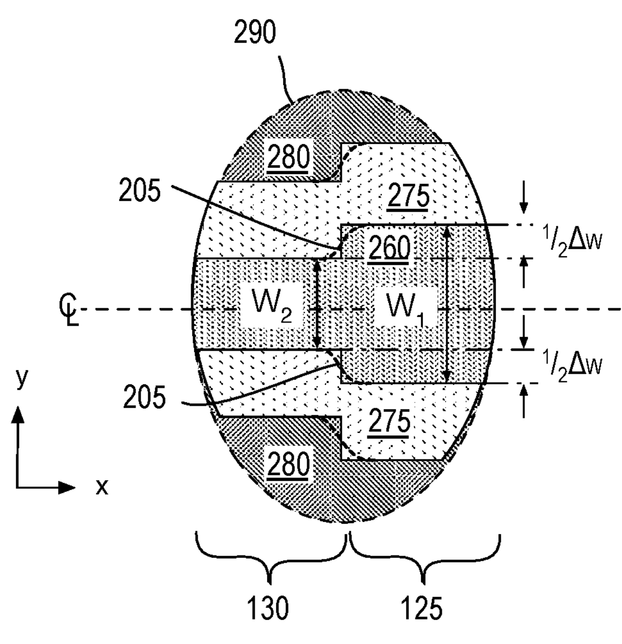
FIG. 2B
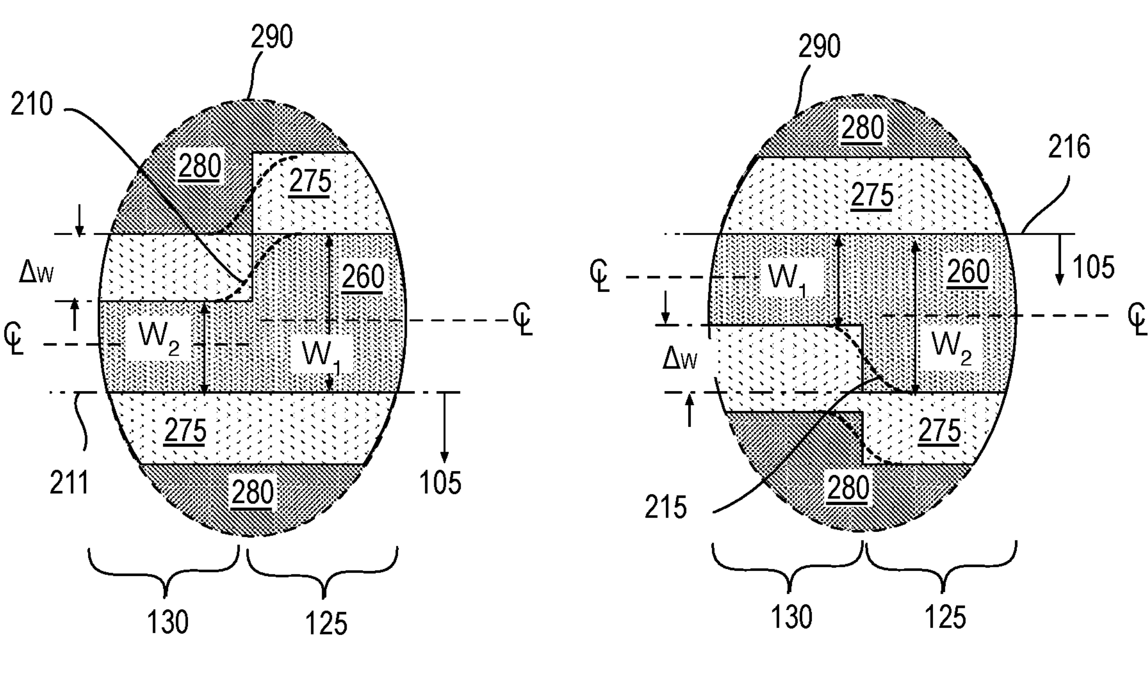
FIG. 2C
FIG. 2D

SRAM WITH NANORIBBON WIDTH MODULATION FOR GREATER READ STABILITY

BACKGROUND

Integrated circuit (IC) devices often include static random-access memory (SRAM). Microprocessor chips, for example, dedicate a significant amount of chip area to SRAM arrays as a lowest level cache storing bits for processing by arithmetic logic units (ALUs). An SRAM array includes a plurality of SRAM bit cells. FIG. 1 illustrates a conventional six-transistor (6T) SRAM bit-cell 100 that includes six transistors comprising two p-channel load or "pull-up" transistors 120 and four n-channel transistors that further comprise two drive or "pull-down" transistors 125 and two pass-gate transistors 130.

During operation of bit-cell 100, when a wordline (WL) is driven to a voltage potential, a bitline (BL) is driven to Vcc and bitline bar (BLB) is driven to Vss, inverter node N1 is exposed to BL, which can induce a read disturbance. Accordingly, many SRAM implementations include read assist circuitry (not depicted) coupled to SRAM bit-cell 100. Read assist circuitry may have various topologies, but is generally operable to lower the wordline (WL) voltage, and thereby weaken the N1/N2 node exposure to BL/BLB. Such read assist circuitry can occupy significant chip area and reduce SRAM read. Accordingly, improvements to an SRAM bit-cell architecture that can reduce the overhead of SRAM read assist circuitry is advantageous.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures:

FIG. 2B illustrates an expanded plan view of the ribbon width transition shown in FIG. 2A, in accordance with some embodiments;

FIGS. 2C and 2D illustrate expanded plan views of a ribbon width transition between pull-down and pass-gate transistors of a SRAM bit-cell, in accordance with some alternative embodiments;

DETAILED DESCRIPTION

Figure 1:
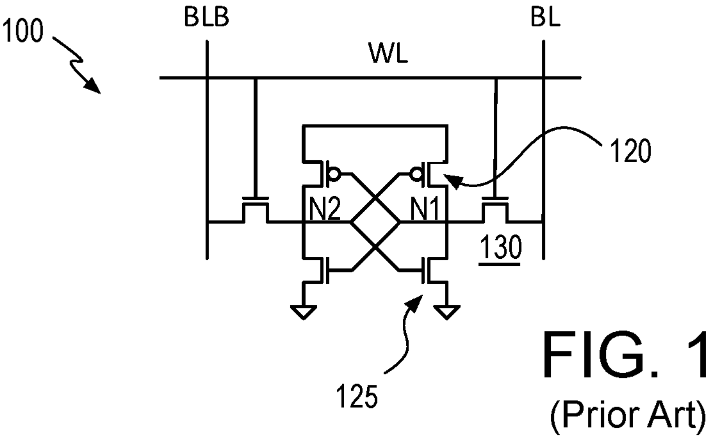
FIG. 1 is a circuit schematic of a conventional 6T-SRAM bit-cell.

Embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

The term "adjacent" here generally refers to a position of a thing being next to (e.g., immediately next to or close to with one or more things between them) or adjoining another thing (e.g., abutting it).

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. These terms are not intended as synonyms for each other. Rather, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause-and-effect relationship).

The terms "over," "under," "between," and "on" as used herein refer to a relative position of one component or material with respect to other components or materials where such physical relationships are noteworthy. For example, in the context of materials, one material or layer over or under another may be directly in contact or may have one or more intervening materials or layers. Moreover, one material between two materials or layers may be directly in contact with the two materials/layers or may have one or more intervening materials/layers. In contrast, a first material or layer "on" a second material or layer is in direct contact with that second material/layer. Similar distinctions are to be made in the context of component assemblies.

The term "signal" may refer to at least one current signal, voltage signal, magnetic signal, or data/clock signal.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Unless otherwise specified in the specific context of use, the term "predominantly" means more than 50%, or more than half. For example, a composition that is predominantly a first constituent means more than half of the composition is the first constituent (e.g., <50 at. %). The term "primarily" means the most, or greatest, part. For example, a composition that is primarily a first constituent means the composition has more of the first constituent than any other constituent. A composition that is primarily first and second constituents means the composition has more of the first and second constituents than any other constituent. The term "substantially" means there is only incidental variation. For example, composition that is substantially a first constituent means the composition may further include <1% of any other constituent. A composition that is substantially first and second constituents means the composition may further include <1% of any constituent substituted for either the first or second constituent.

As used throughout this description, and in the claims, a list of items joined by the term "at least one of" or "one or more of" can mean any combination of the listed terms.

Unless otherwise specified in the explicit context of their use, the terms "substantially equal," "about equal" or "approximately equal" mean that there is no more than incidental variation between two things so described. In the art, such variation is typically no more than +/−10% of a predetermined target value.

In accordance with embodiments herein, integrated circuit (IC) static random-access memory (SRAM) comprises access or pass-gate transistors having different nanoribbon widths than pull-down transistors. A narrower ribbon width within the pass-gate transistor, relative to the pull-down transistor reduces drive current of the pass-gate transistor relative to that of the pull-down transistor for a reference transistor architecture. Accordingly, read instability of a bit-cell, and/or overhead associated with read assist circuitry coupled to the bit-cell may be reduced.

Figure 2A:
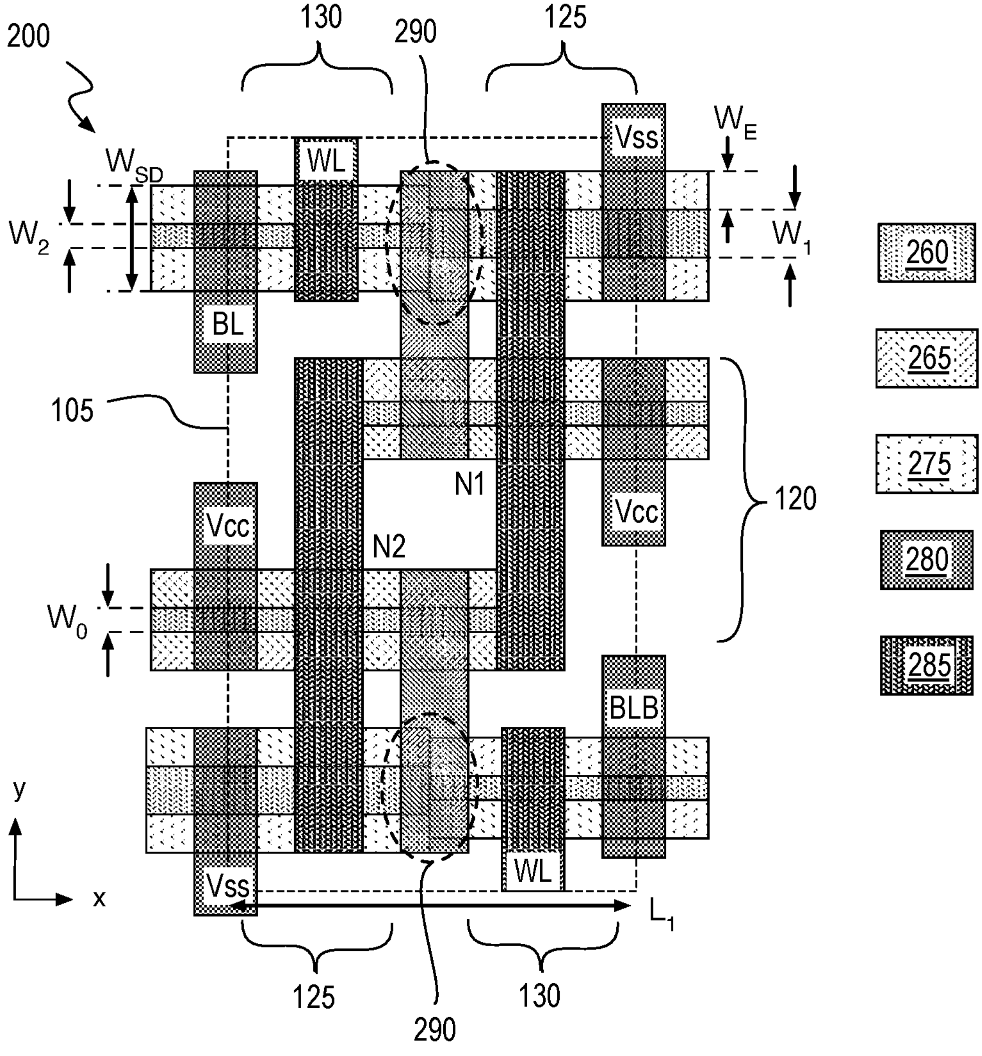
FIG. 2A is a plan view of a 6T-SRAM bit-cell layout with a ribbon width transition between a pull-down and pass-gate transistors, in accordance with some embodiments.

FIG. 2A is a plan view of a 6T-SRAM bit-cell layout 200 with a ribbon width transition 290 between pull-down transistor 125 and pass-gate transistor 130, in accordance with some embodiments. Within pull-down transistor 125, semiconductor nanoribbons 260 have a nanoribbon width $W_1$. Within pass-gate transistor 130, semiconductor nanoribbons 260 have a nanoribbon width $W_2$, which is smaller than width $W_1$. Although implementations may vary, in some exemplary embodiments, width $W_2$ is about 60-85% of $W_1$. Hence, for a reference design where pull-down transistor nanoribbon width $W_1$ is 10 nm, pass-gate transistor nanoribbon width $W_2$ is 6.0-8.5 nm. Nanoribbons 260 for pull-down transistor 125 are abutted end-to-end with nanoribbons 260 for pass-gate transistor 130. In advantageous embodiments, nanoribbons 260 are continuous over the total ribbon length $L_1$ of both pull-down transistor 125 and pass-gate transistor 130, which is at least equal to a length of one side of a bit-cell 105.

As further illustrated, pull-down transistor 125 and pass-gate transistor 130 include impurity doped semiconductor material 275 of a first conductivity type (e.g., n-type), which extends an epitaxial width $W_E$ beyond a sidewall of nanoribbons 260. In the exemplary embodiment, epitaxial width $W_E$ is substantially the same for both pull-down transistor 125 and pass-gate transistor 130. As such, impurity doped semiconductor material 275 has a total source/drain width $W_{SD}$ that differs between pull-down transistor 125 and pass-gate transistor 130 by substantially the same amount as nanoribbon width $W_1$ differs from nanoribbon width $W_2$ (e.g., 1.5-4.0 nm).

A first semiconductor terminal (e.g., source) of pull-down transistor 125 comprising impurity doped semiconductor material 275 is coupled to Vss through a contact metallization 280. A first semiconductor terminal (e.g., source) of pass-gate transistor 130 comprising impurity doped semiconductor material 275 is coupled to a bitline BL through contact metallization 280. A gate electrode 285 of pull-down transistor 125 is coupled to load/pull-up transistors 120. The gate electrode 285 of pass-gate transistor 130 is coupled to a wordline WL. A second semiconductor terminal (e.g., drain) of pull-down transistor 125 is in direct contact with a second semiconductor terminal (e.g., drain) of pass-gate transistor 130, each of which comprises impurity doped semiconductor material 275 that is further coupled to pull-up transistors 120 through contact metallization 280. Bit-cell 105 includes a second pull-down transistor 125 that comprises a portion of another stack of nanoribbons 260 having ribbon width $W_1$ while another pass-gate transistor 130 comprising another portion having ribbon width $W_2$ couples the output of the inverters to a bitline bar BLB.

In some examples where pass-gate transistors 130 and pull-down transistors 125 are both n-type/n-channel devices, pull-up transistors 120 are p-type/p-channel transistors comprising impurity doped semiconductor material 265 of a second conductivity type (e.g., p-type). Transistors 120 and 130 form two cross-coupled inverters where the output of one inverter is the input to the other inverter.

Pull-up transistors 120 comprise nanoribbons 260 of a ribbon width $W_0$. Pull-up transistor ribbon width $W_0$ may vary with implementation. In the illustrated embodiments, pull-up transistor ribbon width $W_0$ is substantially equal to pass-gate transistor ribbon width $W_2$. However, in other embodiments pull-up transistor ribbon width $W_0$ may be greater or smaller than either pull-down transistor ribbon width $W_1$ or pass-gate transistor ribbon width $W_2$. In the illustrated example, the drive strength of pull-up transistors 120 is less than that of pull-down transistors 125. In other embodiments, pull-up transistor ribbon width $W_0$ may be smaller than pass-gate transistor ribbon width $W_2$ so that the drive strength of pull-up transistors 120 is also less than that of pass-gate transistors 130.

As illustrated in FIG. 2A, transition 290 between ribbon widths $W_1$ and $W_2$ is encapsulated between a first portion of the impurity-doped semiconductor material 275 adjacent to nanoribbons 260 of ribbon width $W_2$ having total lateral width $W_{SD}$ that is less than that of a second portion of the impurity-doped semiconductor material 275 adjacent to nanoribbons 260 of ribbon width $W_1$. As so positioned (at physically coupled ends of pass-gate transistor 130 and pull-down transistor 125), any variation in the relative position or shape of ribbon width transition 290 may have little effect on performance of either pass-gate transistor 130 or pull-down transistor 125.

As further illustrated in FIG. 2A, ribbon width transition 290 is under contact metallization 280 with an end of contact metallization 280 overlapping epitaxial width $W_E$ a larger amount where nanoribbons have the smaller ribbon width $W_2$. Being co-located, electrical resistance between contact metallization 280 and each of pull-down transistor 125 and pass-gate transistor 130 may be minimized as current does not need to laterally traverse width transition 290. Contact surface area between impurity-doped semiconductor material 275 and contact metallization 280 may also be increased by any additional sidewall attributable to the change in $W_{SD}$ that occurs at ribbon width transition 290.

FIG. 2B illustrates an expanded plan view of ribbon width transition 290, in accordance with some embodiments. Contact metallization 280 fills the entire area illustrated within transition 290. Under contact metallization 280, both nanoribbon 260 and impurity-doped semiconductor material 275 undergo a change in lateral width, with both nanoribbons 260 and impurity-doped semiconductor material 275 being continuous across the width transition.

For embodiments represented by FIG. 2B, a centerline of nanoribbons 260 of pass-gate transistor 130 is colinear with a centerline of nanoribbons 260 of pull-down transistor 125. Hence, the width transition is substantially symmetrical about the nanoribbon centerline. Where $\Delta W$ is the difference between ribbon width $W_1$ and ribbon width $W_2$, nanoribbon sidewall transitions 205 on each side of the nanoribbon centerline are equal to about one-half of $\Delta W$. Nanoribbon sidewall transitions 205 may be more abrupt (as illustrated in solid line), or less abrupt (as illustrated in dashed line) according to the resolution of the patterning system employed to define nanoribbons 260. Maintaining a centerline for nanoribbons 260 of both pull-down transistor 125 and pass-gate transistor 130 may be advantageous, for example to reduce cell height of bit-cell 105, and/or maximize symmetry within bit-cell 105, and/or minimize any difference in effective length of contact metallization 280 between transistors within bit-cell 105.

FIGS. 2C and 2D illustrate expanded plan views of a ribbon width transition 290, in accordance with some alternative embodiments. In FIG. 2C, nanoribbons 260 of pass-gate transistor 130 have a centerline that is laterally offset from the centerline of nanoribbons 260 of pull-down transistor 125. In this example, where $\Delta W$ is the difference between ribbon width $W_1$ and ribbon width $W_2$, the entire $\Delta W$ is at an exterior sidewall transition 210. Hence, nanoribbons 260 have one colinear sidewall 211 spanning pass-gate transistor 130 and pull-down transistor 125. For this implementation, colinear sidewall 211 is proximal to an interior of bit-cell 105 with sidewall transition 210 being at an exterior of bit-cell 105. Such single-sided embodiments sacrifice some symmetry relative to the embodiments illustrated in FIG. 2A. However, depending on other features of an SRAM bit-cell layout, such asymmetrical ribbon width modulation may nevertheless offer some technical advantages.

In FIG. 2D, nanoribbons 260 of pass-gate transistor 130 have a centerline that is again laterally offset from the centerline of nanoribbons 260 of pull-down transistor 125. In this example, where $\Delta W$ is the difference between ribbon width $W_1$ and ribbon width $W_2$, the entire $\Delta W$ is at interior sidewall transition 215. Hence, nanoribbons 260 have one colinear sidewall 216 spanning pass-gate transistor 130 and pull-down transistor 125. For this implementation, colinear sidewall 216 is proximal to an exterior of bit-cell 105 with sidewall transition 215 being at an interior of bit-cell 105. Such single-sided embodiments, being complementary to those illustrated in FIG. 2C, again sacrifice some symmetry relative to the embodiments illustrated in FIG. 2B. However, such asymmetrical ribbon width modulation might nevertheless offer some technical advantages, such as reduced cell height, if implemented in conjunction with other compatible layout features.

Figure 3:
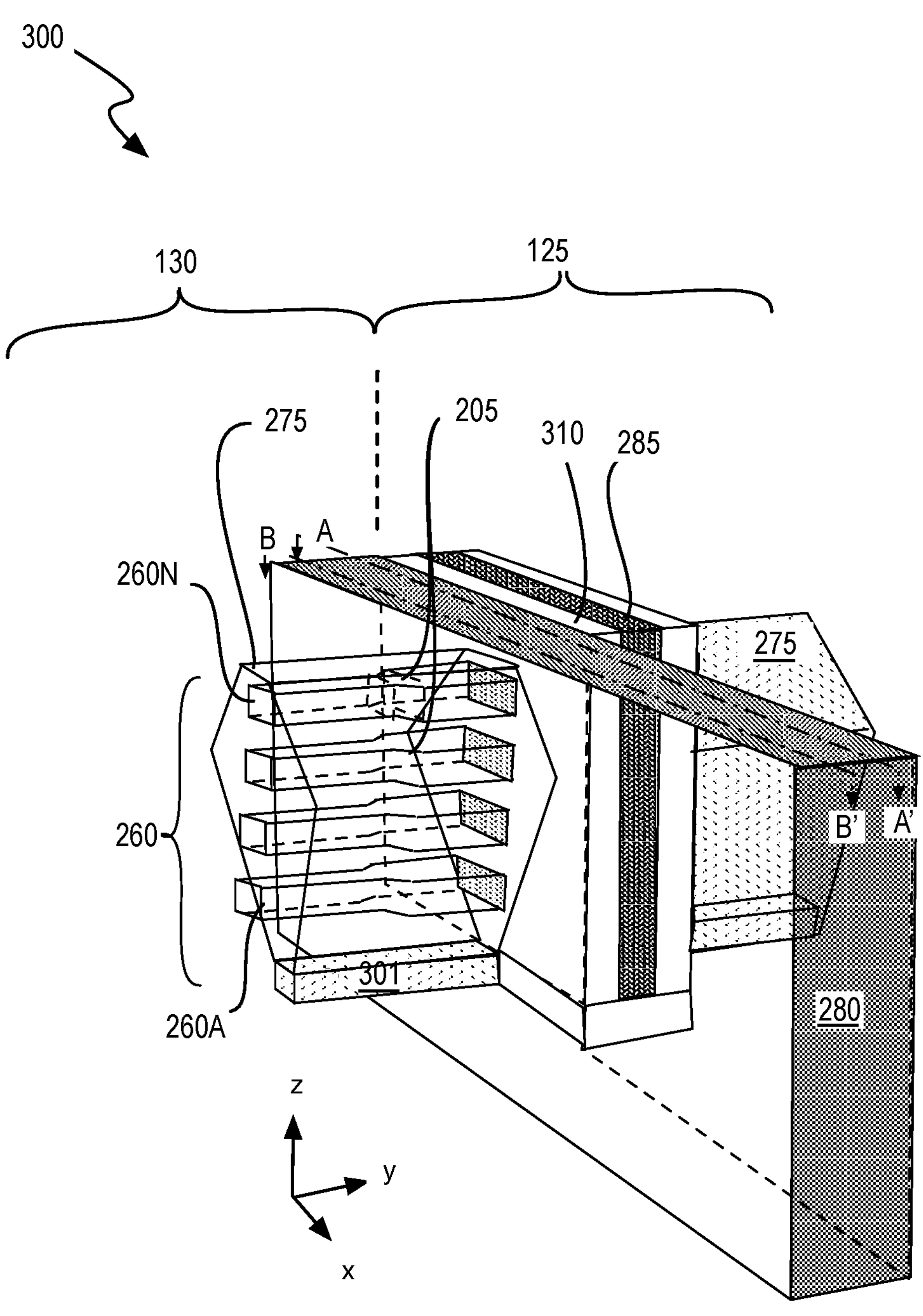
FIG. 3 is an isometric sectional view further illustrating ribbon width modulation at an intersection of pull-down and pass-gate transistors in a SRAM bit-cell structure, in accordance with some nanoribbon embodiments.

Nanoribbon width modulation or contrast between end-abutted pull-down and pass-gate transistors may take any of the forms illustrated in FIG. 2A-2C, or some variation therebetween. FIG. 3 is an isometric sectional view further illustrating ribbon width modulation at an intersection of pull-down and pass-gate transistors in a SRAM bit-cell portion 300, in accordance with some nanoribbon embodiments. The features illustrated in FIG. 3 may be present in any of the embodiments illustrated in FIG. 2B-2D, for example.

In FIG. 3, a portion of pass-gate transistor 130 is illustrated where nanoribbons 260 transition from a narrower ribbon width to a wider ribbon width at an interface with pull-down transistor 125. As shown, transistors 125, 130 both have a stacked, gate-all-around transistor architecture that includes an uppermost nanoribbon 260N stacked in vertical alignment with a lowest nanoribbon 260A with any number of nanoribbons in between. The exemplary ribbon-or-wire (RoW) transistor stack structure is illustrated as including four nanoribbons, but such a transistor stack structure may include any integer number of channel regions (e.g., 2, 3, 4, 5 . . . 10 . . . 20, etc.) as embodiments herein are not limited in this respect.

Within pull-down transistor 125 nanoribbons 260A-260N each have a channel region surrounded by a gate stack that includes gate electrode 285. Impurity-doped semiconductor material 275 is at terminal ends of nanoribbons 260A-260N. Pass-gate transistor 130 includes the same number of nanoribbons 260A-260N. In accordance with the illustrated embodiment, all nanoribbons 260A-260N are coupled together in electrical parallel with their cumulative cross-sectional channel area being a function of their thickness (e.g., z-dimension) and the ribbon width (e.g., x-dimension). Since the sidewall transitions 205 are substantially as illustrated in FIG. 2A, the cumulative cross-sectional channel area of pull-down transistor 125 is larger than that of pass-gate transistor 130 as a function of only their different ribbon widths.

In some embodiments, nanoribbons 260 are crystalline semiconductor. Although the crystalline semiconductor includes polycrystalline thin film material, the crystalline semiconductor may be advantageously substantially monocrystalline. In some such embodiments, the crystallinity of nanoribbons 260 is cubic with the top surfaces having crystallographic orientation of (100), (111), or (110), for example. Other crystallographic orientations are also possible. In some embodiments, nanoribbons 260 are a substantially monocrystalline group IV semiconductor material, such as, but not limited to substantially pure silicon (e.g., having only trace impurities), silicon alloys (e.g., SiGe), germanium alloys (GeSn), or substantially pure germanium (e.g., having only trace impurities).

Nanoribbons 260 may also have any of these same exemplary compositions in alternative polycrystalline or amorphous embodiments, for example where the stack of nanoribbons 260A-260N has been fabricated from a stack of thin film semiconductor material layers. Polycrystalline or amorphous embodiments of nanoribbons 260 may also include semiconducting metal oxides, such as IGZO. Although nanoribbons 260 are illustrated as having a substantially homogenous composition, they may alternatively comprise one or more semiconductor heterojunctions that, for example further include a first semiconductor material adjacent to a second semiconductor material.

Sub-channel material 301 is under the stack of nanoribbons 260. Sub-channel material 301 may have any composition and/or microstructure. For example, in some embodiments where nanoribbons 260 are of a Group IV material (e.g., silicon), sub-channel material 301 is also a Group IV material (e.g., silicon). In some further embodiments where nanoribbons 260 are substantially monocrystalline, sub-channel material 301 is also substantially monocrystalline, and has the same crystallinity and/or crystal orientation as that of nanoribbons 260. In alternative embodiments, sub-channel material 301 is a buried insulator layer (e.g., $SiO_2$), for example of a semiconductor-on-insulator (SOI) substrate.

Gate electrode 285 is part of a gate stack that further includes a gate insulator (not depicted), which co-axially clads channel regions of nanoribbons 260 to provide gate-all-around control of channel conductivity. Gate electrode 285 may include any suitable workfunction metal, such as n-type workfunction metal, which may have a workfunction between about 3.9 eV and about 4.2 eV, for example. Suitable n-type work function metals include, but are not limited to, hafnium, zirconium, titanium, tantalum, aluminum, and metal carbides that include these elements (e.g., titanium carbide, zirconium carbide, tantalum carbide, hafnium carbide and aluminum carbide). Gate insulator(s) between gate electrode 285 and nanoribbons 260 may have any composition, and may, for example, include a high-k material (with a bulk relative permittivity greater than 8). Exemplary gate insulators include $HfO_2$ and $ZrO_2$.

Impurity doped semiconductor 275 is electrically and physically coupled to opposite sides of channel regions of nanoribbons 260A-260N. In this example, impurity doped semiconductor 275 comprises faceted epitaxial material that has been grown, for example laterally from an end portion of channel regions embedded with in a spacer dielectric material 310, and/or from cantilevered source/drain ends of nanoribbons 260A-260N, and/or from sub-channel material 301. Impurity doped semiconductor 275 need not be epitaxial material, in which case the facets shown in FIG. 3 may not be present. Impurity doped semiconductor 275 also need not merge into a unitary body, in which case cantilevered source/drain nanowire ends may be individually in contact with contact metallization 280.

Figure 4A:
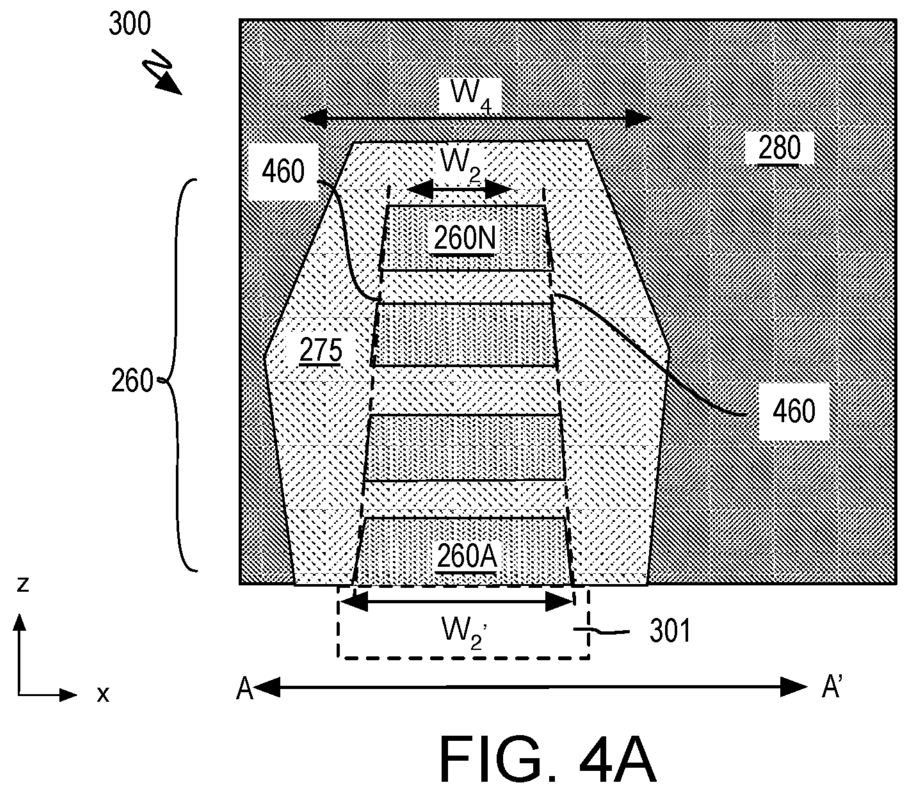
FIG. 4A is a first cross-sectional view through a terminal of the pull-down transistor of the SRAM bit-cell shown in FIG. 3, in accordance with some embodiments.
Figure 4B:
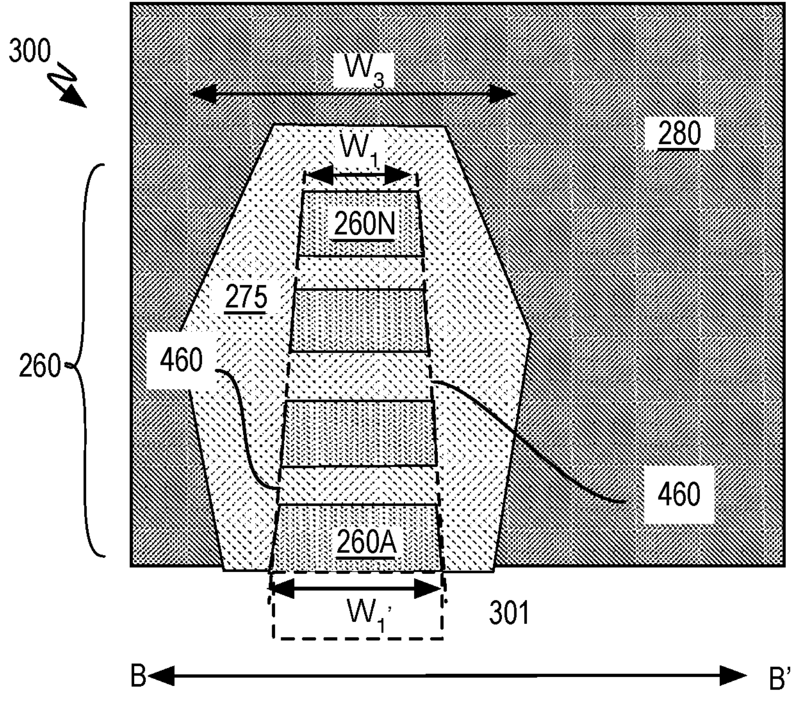
FIG. 4B is a second cross-sectional view through a terminal of the pass-gate transistor of the SRAM bit-cell shown in FIG. 3, in accordance with some embodiments.

In FIG. 3, two parallel planes passing through a length of contact metallization 280 are demarked by dashed lines A-A' and B-B'. The A-A' plane and B-B' plane are both "ribbon-cut" planes that pass through a transverse width of nanoribbons 260 on opposite sides of sidewall transition 205. FIG. 4A is a first cross-sectional view along plane A-A', in accordance with some embodiments. FIG. 4B is a second cross-sectional view through plane B-B', in accordance with some embodiments.

Referring first to FIG. 4A, nanoribbons 260 are bodies of semiconductor material that may have been patterned from a fin of a substrate material layer, for example having the dashed nanoribbon sidewalls 460. The slightly positive slope of sidewalls 460 results in each of nanoribbons 260A-260N having a trapezoidal slab profile representative of structural asymmetry associated with front-side transistor fabrication. Such asymmetry may be a result of nanoribbon sidewall 460 evolving during subtractive patterning of a fin into a stack of semiconductor materials, for example. Although nanoribbons 260 are illustrated as having a transverse (x) width greater than their vertical (z) thickness, nanoribbons 260 may instead have a vertical thickness greater than, or substantially equal to, their transverse width.

As a result of non-idealities in sidewalls 460, not all nanoribbons 260A-260N necessarily have precisely the same ribbon width. For example, within the A-A' plane an uppermost nanoribbon 260N has ribbon width $W_2$ while lowest nanoribbon 260A has a slightly larger ribbon width $W_2'$. The difference between top and bottom ribbon widths $W_2$ and $W_2'$ may vary with implementation. However, in some exemplary embodiments the difference between top and bottom ribbon widths $W_2$ and $W_2'$ is less than the difference between ribbon widths $W_2$ and $W_1$ (FIG. 4B). Alternatively, uppermost nanoribbon 260N may have a ribbon width smaller than $W_2$ while lowest nanoribbon 260A has ribbon width $W_2$. In still other embodiments, a center nanoribbon may have ribbon width $W_2$ while uppermost nanoribbon 260N has a ribbon width slightly smaller that ribbon width $W_2$ while lowest nanoribbon 260A has a width slightly larger than ribbon width $W_2$.

As further illustrated in FIG. 4B, nanoribbons 260 have substantially the same slab profiles as illustrated in FIG. 4A. However, within the B-B' plane uppermost nanoribbon 260N has ribbon width $W_1$ while lowermost nanoribbon 260A has a slightly larger ribbon width $W_1'$. The difference between top and bottom ribbon widths $W_1$ and $W_1'$ may again vary with implementation. However, in some exemplary embodiments the difference between top and bottom ribbon widths $W_1$ and $W_1'$ is less than the difference between ribbon widths $W_2$ (FIG. 4A) and $W_1$. Alternatively, uppermost nanoribbon 260N may have a ribbon width smaller than $W_1$ while lowest nanoribbon 260A has ribbon width $W_1$. In still other embodiments, a center nanoribbon may have ribbon width $W_1$ while uppermost nanoribbon 260N has a ribbon width slightly smaller that ribbon width $W_1$ while lowest nanoribbon 260A has a width slightly larger than ribbon width $W_1$.

Hence, as illustrated in FIG. 4B, the portion of nanoribbons 260 within pass-gate transistor 130 has ribbon widths associated with ribbon width $W_1$, while the portion of nanoribbons 260 within pull-down transistor 125 has second ribbon widths associated with ribbon width $W_2$ (as further illustrated in FIG. 4A).

Impurity-doped semiconductor 275 may comprise one or more electrically active impurities. In some embodiments, for example, impurity-doped semiconductor 275 is a Group IV semiconductor material (e.g., Si, Ge, SiGe or GeSn alloy). For exemplary embodiments where pull-down and pass-gate transistors 125 and 130 are both NMOS, impurity doped semiconductor 275 comprises an n-type impurity such as phosphorus, arsenic, or antimony. Impurity-doped semiconductor 275 within plane A-A' (FIG. 4A) has a total lateral width of $W_4$, which is larger than total lateral width of $W_3$ within plane B-B' (FIG. 4B) substantially as described above.

Figure 5:
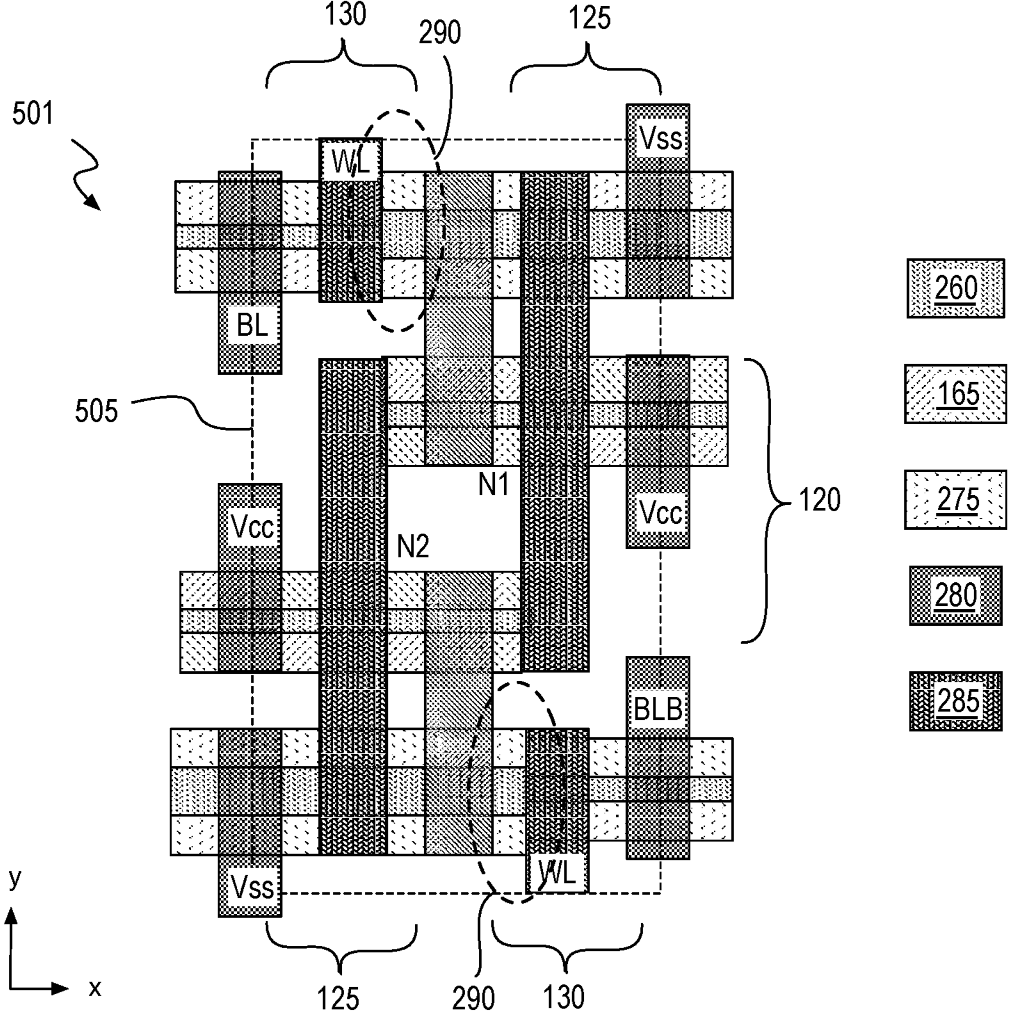
FIG. 5 is a plan view of a 6T-SRAM bit-cell layout with a nanoribbon width transition between a pull-down and pass-gate transistors, in accordance with some alternative embodiments.

Ribbon width modulations between colinear pull-down and pass-gate transistors, for example as illustrated in FIG. 3, may also be implemented in bit-cell layouts other than the layout introduced in FIG. 2A. For example, FIG. 5 is a plan view of another 6T-SRAM bit-cell layout 501 where the nanoribbon width transition 290 between colinear pass-gate transistor 130 and pull-down transistor 125 is positioned between contact metallization 280 and gate electrode 285 of pass-gate transistor 130. Ribbon width transition 290 is therefore proximal to a sidewall of gate electrode 285 and not under contact metallization 280. Although symmetrical (two-sided) ribbon width modulation is illustrated in FIG. 5 to provide the best comparison with FIG. 2A, any of the asymmetrical ribbon width modulations (e.g., like FIGS. 2C and 2D) may also be implemented for transition 290 within bit-cell 505.

Figure 6:
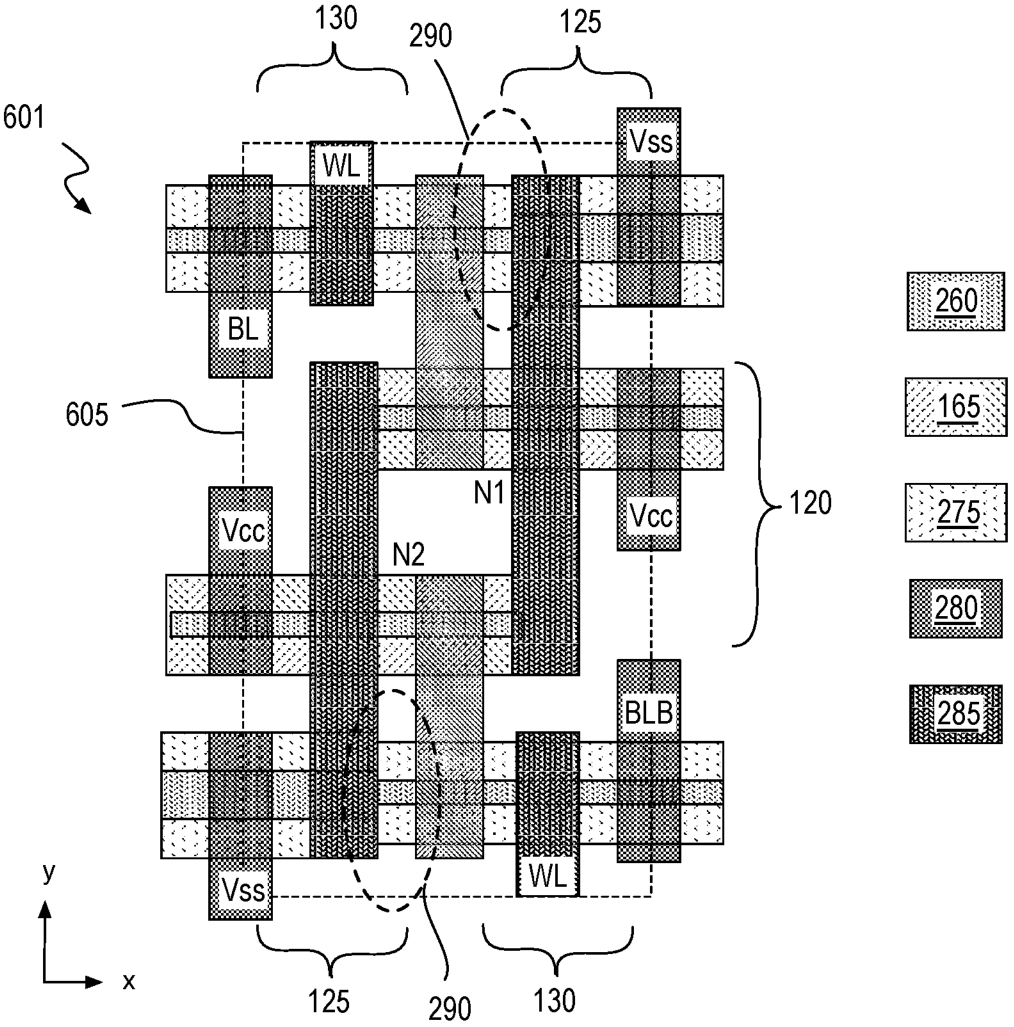
FIG. 6 is a plan view of a 6T-SRAM bit-cell layout with a nanoribbon width transition between a pull-down and pass-gate transistors, in accordance with some alternative embodiments.

FIG. 6 is a plan view of another 6T-SRAM bit-cell layout 601 including a nanoribbon width contrast between pull-down and pass-gate transistors, in accordance with some other alternative embodiments. In bit-cell 605, nanoribbon width transition 290 between colinear pass-gate transistor 130 and pull-down transistor 125 is positioned between contact metallization 280 and gate electrode 285 of pull-down transistor 125. Ribbon width transition 290 is therefore again proximal to a sidewall of gate electrode 285, and not under contact metallization 280. Although symmetrical (two-sided) ribbon width modulation is illustrated in FIG. 6 to provide the best comparison with FIG. 2A and FIG. 5, any of the asymmetrical ribbon width modulations (e.g., similar to FIGS. 2C and 2D) may also be implemented for transition 290 within bit-cell 605.

Figure 7:
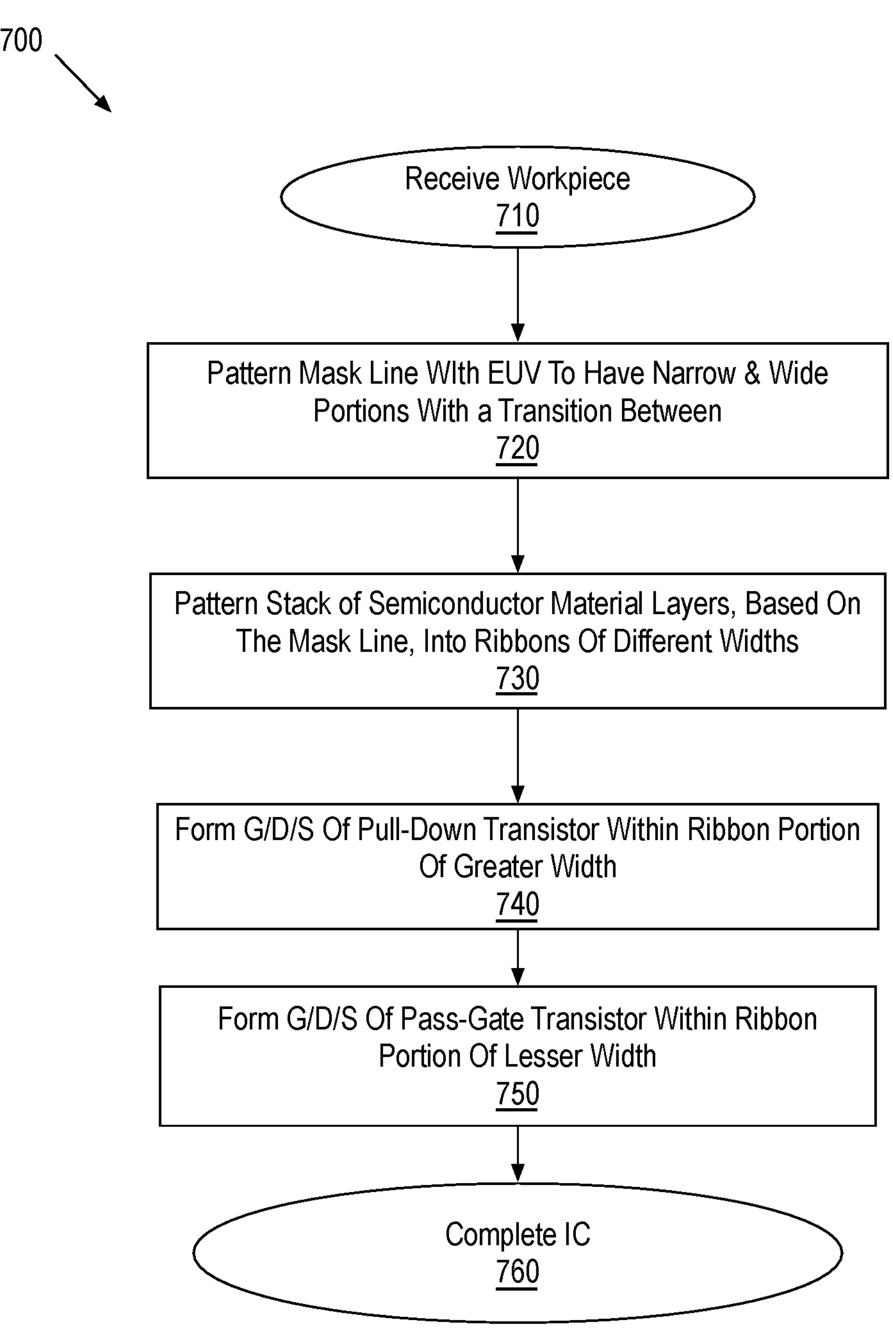
FIG. 7 is a flow diagram illustrating a method of fabricating an SRAM bit-cell with nanoribbons of different widths, in accordance with some embodiments.

The nanoribbon width contrast provided between pull-down and pass-gate transistors may be implemented through the practice of any IC fabrication process suitable for fabricating stacked GAA transistor structures with sufficient patterning resolution to form nanoribbon structures of with a modulated ribbon width. FIG. 7 is a flow diagram of methods 700 for fabricating an SRAM bit-cell with nanoribbons of contrasting widths, in accordance with some embodiments.

Methods begin at input 710 where a workpiece is received. In some embodiments, the workpiece received at input 710 is a wafer suitable for IC die fabrication. The workpiece may, for example, further include part of a workpiece substrate (e.g., a large format semiconductor wafer) that is to become an IC chip. Methods 700 continue at block 720 where a continuous mask line is patterned with a first width over a first portion of the mask line and a second width (e.g., smaller) than the first width over a second portion of the mask line. In exemplary embodiments, the mask line is defined in a mask material with an extreme ultraviolet lithography (EUV or EUVL) technology, for example using the 13.5 nm EUV center wavelength (13.3-13.7 nm band).

Methods 700 continue at block 730 where a stack of semiconductor material layer are patterned based on the mask line patterned at block 720. The width contrast within the mask line is translated into nanoribbons of the semiconductor material having a similar width contrast.

At block 740, gate (G), source (S) and drain (D) terminals of an SRAM bit-cell pull-down transistor are formed with at least the gate being formed around a region of the semiconductor nanoribbons having a greater ribbon width. At block 750, gate, source and drain terminals of an SRAM bit-cell pass-gate transistor are formed with at least the gate being formed around a region of the semiconductor nanoribbons having a lessor ribbon width. Any fabrication techniques known to be suitable for forming nanoribbon transistor terminals may be practiced at blocks 740 and 750 as embodiments herein are not limited in this respect. Methods 700 then end at output 760 where any known fabrication techniques may be practiced to complete an IC including the SRAM bit-cell.

Figure 8:
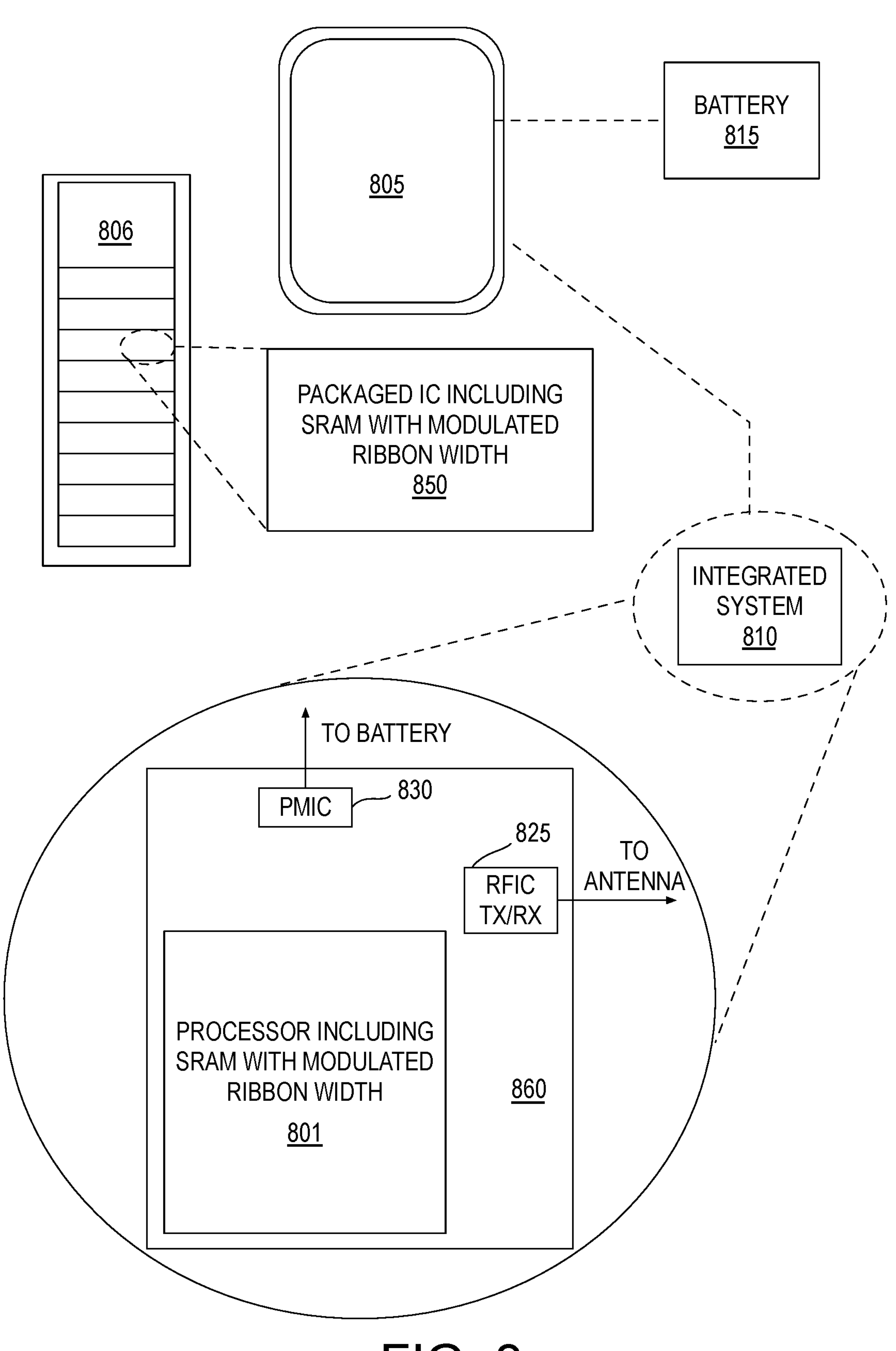
FIG. 8 illustrates a mobile computing platform and a data server machine employing an IC that includes an SRAM with modulated ribbon widths, in accordance with some embodiments.

FIG. 8 illustrates a mobile computing platform 805 and a data server computing platform 806 employing a packaged IC including an SRAM with modulated ribbon widths, for example substantially as described elsewhere herein. The server platform 806 may be any commercial server, for example including any number of high-performance computing platforms disposed within a rack and networked together for electronic data processing, which in the exemplary embodiment includes a packaged IC 850 with an SRAM that has modulated ribbon widths, for example substantially as described elsewhere herein.

The mobile computing platform 805 may be any portable device configured for each of electronic data display, electronic data processing, wireless electronic data transmission, or the like. For example, the mobile computing platform 805 may be any of a tablet, a smart phone, laptop computer, etc., and may include a display screen (e.g., a capacitive, inductive, resistive, or optical touchscreen), a chip-level or package-level integrated system 810, and a battery 815. At least one IC of chip-level or package-level integrated system 810 includes packaged IC includes an SRAM with modulated ribbon widths, for example substantially as described elsewhere herein.

In the example shown in the expanded view, integrated system 810 includes a microprocessor 801 that includes an SRAM with modulated ribbon widths, for example substantially as described elsewhere herein. Microprocessor 801 may be further coupled to a host substrate 860. One or more of a power management integrated circuit (PMIC) 830 or an RF (wireless) integrated circuit (RFIC) 825 including a wideband RF (wireless) transmitter and/or receiver (TX/RX) may be further coupled to host substrate 860.

Functionally, PMIC 830 may perform battery power regulation, DC-to-DC conversion, etc., and so has an input coupled to battery 815 and with an output providing a current supply to other functional modules (e.g., microprocessor 801). As further illustrated, in the exemplary embodiment, RFIC 825 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 4G, 5G, and beyond.

Figure 9:
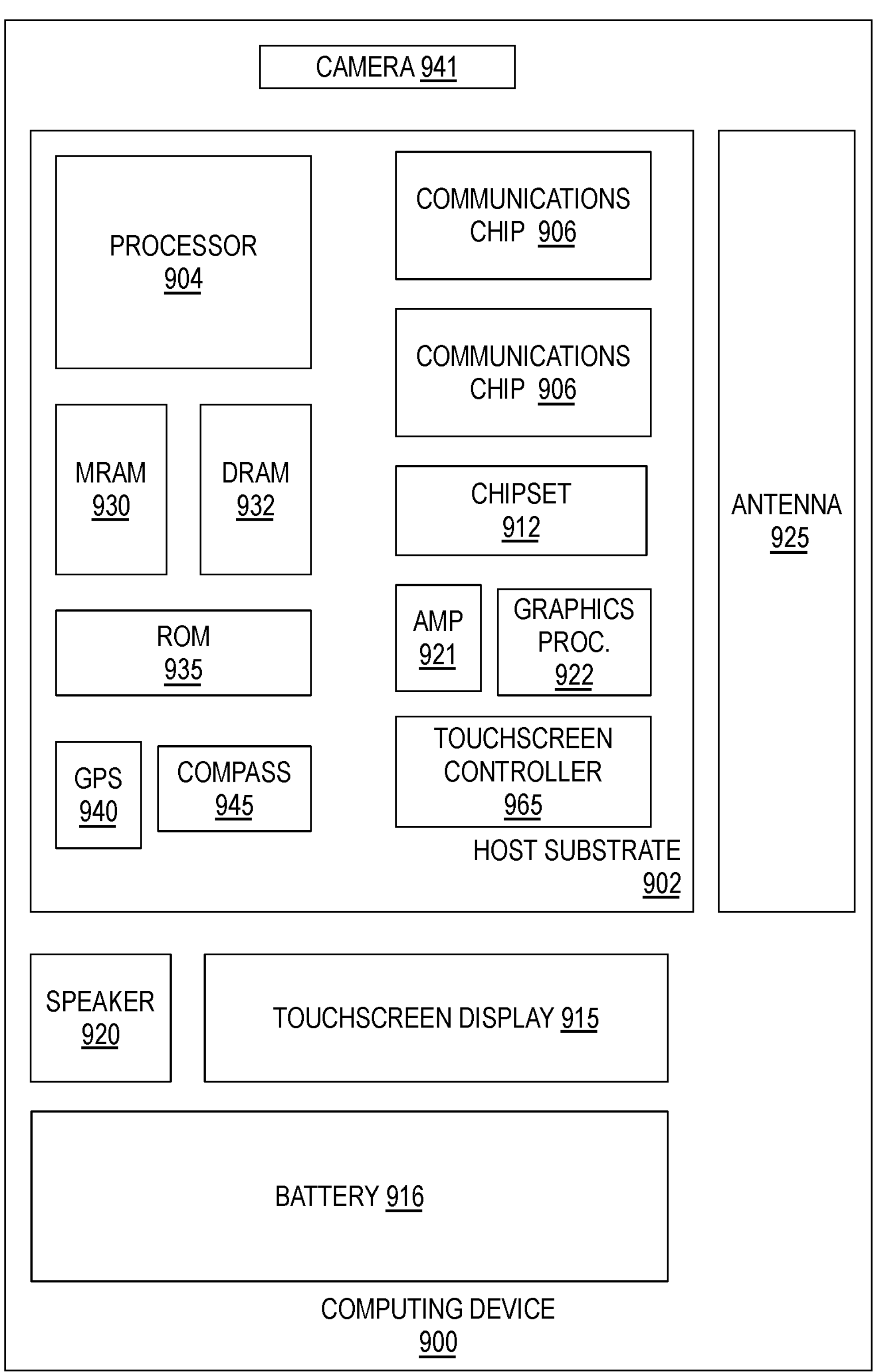
FIG. 9 is a functional block diagram of an electronic computing device, in accordance with some embodiments.

FIG. 9 is a functional block diagram of an electronic computing device 900, in accordance with an embodiment of the present invention. Computing device 900 may be found inside platform 805 or server platform 806, for example. Device 900 further includes a host substrate 902 hosting a number of components, such as, but not limited to, a processor 904 (e.g., an applications processor with an arithmetic logic unit). Processor 904 may be physically and/or electrically coupled to host substrate 902. In some examples, processor 904 includes an SRAM with modulated ribbon widths, for example substantially as described elsewhere herein. In general, the term "processor" or "microprocessor" may refer to any device or portion of a device that processes electronic data from registers and/or memory to transform that electronic data into other electronic data that may be further stored in registers and/or memory.

In various examples, one or more communication chips 906 may also be physically and/or electrically coupled to the host substrate 902. In further implementations, communication chips 906 may be part of processor 904. Depending on its applications, computing device 900 may include other components that may or may not be physically and electrically coupled to host substrate 902. These other components include, but are not limited to, volatile memory (e.g., DRAM 932), non-volatile memory (e.g., ROM 935), flash memory (e.g., NAND or NOR), magnetic memory (MRAM 930), a graphics processor 922, a digital signal processor, a crypto processor, a chipset 912, an antenna 925, touchscreen display 915, touchscreen controller 965, battery 916, audio codec, video codec, power amplifier 921, global positioning system (GPS) device 940, compass 945, accelerometer, gyroscope, speaker 920, camera 941, and mass storage device (such as hard disk drive, solid-state drive (SSD), compact disk (CD), digital versatile disk (DVD), and so forth), or the like. In some exemplary embodiments, at least one of the functional blocks noted above include SRAM with modulate ribbon widths, for example as described elsewhere herein.

Communication chips 906 may enable wireless communications for the transfer of data to and from the computing device 900. The term "wireless" and its derivatives may be used to describe circuits, devices, systems, methods, techniques, communications channels, etc., that may communicate data using modulated electromagnetic radiation through a non-solid medium. The term does not imply that the associated devices do not contain any wires, although in some embodiments they might not. Communication chips 906 may implement any of many wireless standards or protocols, including but not limited to those described elsewhere herein. As discussed, computing device 900 may include a plurality of communication chips 906. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

It will be recognized that the invention is not limited to the exemplary embodiments described in detail but can be practiced with modification and alteration without departing from the scope of the appended claims. For example, the above embodiments may include specific combinations of features as further provided below.

In first examples, a static random-access memory (SRAM) cell structure, comprises a first transistor comprising a first portion of a stack of nanoribbons that have first ribbon widths; and a second transistor of a same conductivity type as the first transistor. The second transistor comprises a second portion of the stack of nanoribbons, wherein the second portion has second ribbon widths, larger than the first ribbon widths, and wherein a centerline of the first portion of the stack of nanoribbons is colinear with a centerline of the second portion of the stack of nanoribbons.

In second examples, a transition between the first ribbon widths and the second ribbon widths is encapsulated by an n-type impurity-doped semiconductor material.

In third examples, for any of the second examples a first portion of the n-type impurity-doped semiconductor material adjacent to the first portion of the stack of nanoribbons has a narrower total width than a second portion of the n-type impurity-doped semiconductor material adjacent to the second portion of the stack of nanoribbons.

In fourth examples, for any of the second examples comprising a metallization feature in contact with the n-type impurity-doped semiconductor material, wherein the transition between the first ribbon widths and the second ribbon widths is under the metallization feature.

In fifth examples, for any of the first through fourth examples a transition between the first ribbon widths and the second ribbon widths is between a gate electrode of the first transistor and an n-type impurity-doped semiconductor material of the second transistor.

In sixth examples, for any of the first through fifth examples a transition between the first ribbon widths and the second ribbon widths is between a gate electrode of the second transistor and an n-type impurity-doped semiconductor material of the second transistor.

In seventh examples, for any of the first through sixth examples the first transistor is a pass-gate transistor and the second transistor is an pull-down transistor. SRAM cell structure further comprises a second pass-gate transistor comprising a first portion of a second stack of nanoribbons having the first ribbon widths. A second pull-down transistor comprising a second portion of the second stack of nanoribbons having the second ribbon widths. A centerline of the first portion of the second stack of nanoribbons is colinear with a centerline of the second portion of the second stack of nanoribbons.

In eighth examples, for any of the first through seventh examples, the SRAM cell structure further comprises a pair of pull-up transistors comprising a stack of nanoribbons having at most the first ribbon widths.

In ninth examples, for any of the eighth examples the pull-up transistors comprise a stack of nanoribbons having less than the second ribbon widths.

In tenth examples, a static random-access memory (SRAM) cell structure comprises a first transistor comprising a first portion of a stack of nanoribbons that have first ribbon widths, and a second transistor of a same conductivity type as the first transistor. The second transistor comprises a second portion of the stack of nanoribbons. The second portion has second ribbon widths, larger than the first ribbon widths. A transition between the first ribbon widths and the second ribbon widths is encapsulated in an n-type impurity-doped source or drain material.

In eleventh examples, for any of the tenth examples a centerline of the first portion of nanoribbons is colinear with a centerline of the second portion of nanoribbons.

In twelfth examples, for any of the tenth through eleventh examples a centerline of the first portion of the stack of nanoribbons is laterally offset from the second portion of the stack of semiconductor nanoribbons by an amount substantially equal to a difference between the first and second ribbon widths.

In thirteenth examples, for any of the twelfth examples a first side of the first portion of the stack of nanoribbons colinear with a first side of the second portion of the stack of nanoribbons faces an exterior of the cell structure, and a second side of the first portion of that of nanoribbons colinear with a second side of the second portion of the stack of nanoribbons faces an interior of the cell structure.

In fourteenth examples, for any of the twelfth through thirteenth examples a first side of the first portion of the stack of nanoribbons colinear with a first side of the second portion of the stack of nanoribbons is facing an interior of the cell structure, and a second side of the first portion of that of nanoribbons colinear with a second side of the second portion of the stack of nanoribbons is facing an exterior of the cell structure.

In fifteenth examples, a device comprises a microprocessor comprising an arithmetic logic unit, and a cache memory comprising an SRAM array, wherein the SRAM array comprises a plurality of bit-cells and each bit cell comprises the SRAM structure of any one of the first through ninth examples or any one of the tenth through fourteenth examples. A power supply coupled to power the microprocessor.

In sixteenth examples, a method of fabricating a static random-access memory (SRAM) structure comprises patterning a mask line to have a first portion of a first width, a second portion of a second width, larger than the first width, and a transition region therebetween. A centerline of the first portion is substantially colinear with a centerline of the second portion. The method comprises patterning a stack of semiconductor material layers, based on the mask line, into nanoribbons with a first portion of first ribbon widths and a second portion of second ribbon widths, larger than the first ribbon widths. The method comprises forming a first transistor structure comprising the first portion of the nanoribbons and forming a second transistor structure comprising the second portion of the nanoribbons, the second transistor of the same conductivity type as the first transistor.

In seventeenth examples, for any of the sixteenth examples patterning the mask line further comprises an extreme ultraviolet (EUV) lithography process.

In eighteenth examples, for any of the sixteenth or seventeenth examples the first ribbon widths are no more than 8 nm and the second ribbon widths are no more than 10 nm.

In nineteenth examples for any of the sixteenth through eighteenth examples forming the first transistors comprises forming a first gate over the first portion of the nanoribbons.

In twentieth examples, for any of the nineteenth examples forming the second transistors comprises forming a second gate over the second portion of the nanoribbons.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

What is claimed is:

1. A static random-access memory (SRAM) cell structure, comprising:

a first transistor comprising a first portion of a stack of nanoribbons that have first ribbon widths; and a second transistor of a same conductivity type as the first transistor, the second transistor comprising a second portion of the stack of nanoribbons, contiguous with the first portion, wherein the second portion has second ribbon widths, larger than the first ribbon widths, and wherein a centerline of the first portion of the stack of nanoribbons is colinear with a centerline of the second portion of the stack of nanoribbons.

2. The SRAM cell structure of claim 1, wherein the first transistor has n-type conductivity, and a transition between the first ribbon widths and the second ribbon widths is encapsulated by an n-type impurity-doped semiconductor material.

3. The SRAM cell structure of claim 2, wherein a first portion of the n-type impurity-doped semiconductor material adjacent to the first portion of the stack of nanoribbons has a narrower total width than a second portion of the n-type impurity-doped semiconductor material adjacent to the second portion of the stack of nanoribbons.

4. The SRAM cell structure of claim 2, further comprising a metallization feature in contact with the n-type impurity-doped semiconductor material, wherein the transition between the first ribbon widths and the second ribbon widths is under the metallization feature.

5. The SRAM cell structure of claim 1, wherein a transition between the first ribbon widths and the second ribbon widths is between a gate electrode of the first transistor and an n-type impurity-doped semiconductor material of the second transistor.

6. The SRAM cell structure of claim 1, wherein a transition between the first ribbon widths and the second ribbon widths is between a gate electrode of the second transistor and an n-type impurity-doped semiconductor material of the first transistor.

7. The SRAM cell structure of claim 1, wherein the first transistor is a pass-gate transistor and the second transistor is a pull-down transistor, and the SRAM cell structure further comprises a second pass-gate transistor comprising a first portion of a second stack of nanoribbons having the first ribbon widths; and a second pull-down transistor comprising a second portion of the second stack of nanoribbons having the second ribbon widths, wherein a centerline of the first portion of the second stack of nanoribbons is colinear with a centerline of the second portion of the second stack of nanoribbons.

8. The SRAM cell structure of claim 1, wherein the first transistor is a pass-gate transistor and the second transistor is a pull-down transistor, and the SRAM cell structure further comprises a pair of pull-up transistors comprising a stack of nanoribbons having at most the first ribbon widths.

9. The SRAM cell structure of claim 8, wherein the pull-up transistors comprise a stack of nanoribbons having third ribbon widths less than the second ribbon widths.

10. A static random-access memory (SRAM) cell structure, comprising:

a first transistor comprising a first portion of a stack of nanoribbons that have first ribbon widths; and a second transistor of a same conductivity type as the first transistor, the second transistor comprising a second portion of the stack of nanoribbons, wherein the second portion has second ribbon widths, larger than the first ribbon widths, and wherein a transition between the first ribbon widths and the second ribbon widths is encapsulated in an n-type impurity-doped source or drain material.

11. The SRAM cell structure of claim 10, wherein a centerline of the first portion of nanoribbons is colinear with a centerline of the second portion of nanoribbons.

12. The SRAM cell structure of claim 10, wherein a centerline of the first portion of the stack of nanoribbons is laterally offset from the second portion of the stack of nanoribbons by an amount substantially equal to a difference between the first and second ribbon widths.

13. The SRAM cell structure of claim 12, wherein a first side of the first portion of the stack of nanoribbons colinear with a first side of the second portion of the stack of nanoribbons faces an exterior of the cell structure.

14. The SRAM cell structure of claim 12, wherein a first side of the first portion of the stack of nanoribbons colinear with a first side of the second portion of the stack of nanoribbons is facing an interior of the cell structure.

15. The SRAM cell structure of claim 12, wherein a first portion of the n-type impurity-doped source or drain material adjacent to the first portion of the stack of nanoribbons has a narrower total width than a second portion of the n-type impurity-doped source or drain material adjacent to the second portion of the stack of nanoribbons.

16. The SRAM cell structure of claim 12, further comprising a metallization feature in contact with the n-type impurity-doped source or drain material, wherein the transition between the first ribbon widths and the second ribbon widths is under the metallization feature.

17. The SRAM cell structure of claim 12, wherein the first transistor is a pass-gate transistor and the second transistor is a pull-down transistor, and the SRAM cell structure further comprises a pair of pull-up transistors comprising a stack of nanoribbons having at most the first ribbon widths.

18. The SRAM cell structure of claim 17, wherein the pull-up transistors comprise a stack of nanoribbons having third ribbon widths less than the second ribbon widths.

19. A device comprising:

a microprocessor comprising:

an arithmetic logic unit; and a cache memory comprising an SRAM array, wherein the SRAM array comprises a plurality of bit-cells and each bit cell comprises:

the SRAM structure of claim 1; and a power supply coupled to power the microprocessor.

* * * * *